(12) United States Patent
Magnee et al.

(10) Patent No.: US 9,484,398 B2
(45) Date of Patent: Nov. 1, 2016

(54) METAL-INSULATOR-METAL (MIM) CAPACITOR

(71) Applicant: NXP B.V., Eindhoven (NL)

(72) Inventors: Petrus Hubertus Cornelis Magnee, Malden (NL); Patrick Sebel, Zeist (NL)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/925,205

(22) Filed: Oct. 28, 2015

(65) Prior Publication Data

US 2016/0049461 A1 Feb. 18, 2016

Related U.S. Application Data

(62) Division of application No. 14/011,896, filed on Aug. 28, 2013, now abandoned.

(30) Foreign Application Priority Data

Sep. 21, 2012 (EP) ...................................... 12185518

(51) Int. Cl.
| | |
|---|---|
| *H01L 21/00* | (2006.01) |
| *H01L 49/02* | (2006.01) |
| *H01L 21/768* | (2006.01) |
| *H01L 21/311* | (2006.01) |
| *H01L 23/522* | (2006.01) |
| *H01L 21/31* | (2006.01) |
| *H01L 21/3213* | (2006.01) |
| *H01L 23/538* | (2006.01) |

(Continued)

(52) U.S. Cl.
CPC ............... *H01L 28/60* (2013.01); *H01L 21/31* (2013.01); *H01L 21/31111* (2013.01); *H01L 21/31144* (2013.01); *H01L 21/32133* (2013.01); *H01L 21/7687* (2013.01); *H01L 21/76879* (2013.01); *H01L 21/76897* (2013.01); *H01L 21/76898* (2013.01); *H01L 23/5223* (2013.01); *H01L 23/5384* (2013.01); *H01L 23/5386* (2013.01); *H01L 27/0629* (2013.01); *H01L 28/40* (2013.01); *H01L 28/75* (2013.01); *H01L 23/53223* (2013.01); *H01L 23/53238* (2013.01); *H01L 2924/0002* (2013.01)

(58) Field of Classification Search
CPC ... H01L 28/40; H01L 28/75; H01L 21/7687; H01L 21/31144; H01L 21/76897
See application file for complete search history.

(56) References Cited

U.S. PATENT DOCUMENTS

| | | | |
|---|---|---|---|
| 8,581,318 | B1 | 11/2013 | Chen et al. |
| 2003/0057471 | A1 | 3/2003 | List et al. |

(Continued)

FOREIGN PATENT DOCUMENTS

| | | |
|---|---|---|
| DE | 102004039803 A1 | 3/2006 |
| GB | 2390223 A | 12/2003 |

OTHER PUBLICATIONS

Van Noort, W.D. et al.; "BiCMOS Technology Improvements for Microwave Application"; IEEE BCTM, pp. 93-96, Oct. 2008.

(Continued)

*Primary Examiner* — Ngan Ngo

(57) ABSTRACT

There is disclosed a metal-insulator-metal, MIM, capacitor. The MIM capacitor comprises a MIM stack formed within an interconnect metal layer. The interconnect metal layer is utilized as an electrical connection to a metal layer of the MIM stack.

11 Claims, 5 Drawing Sheets

Figure 1:
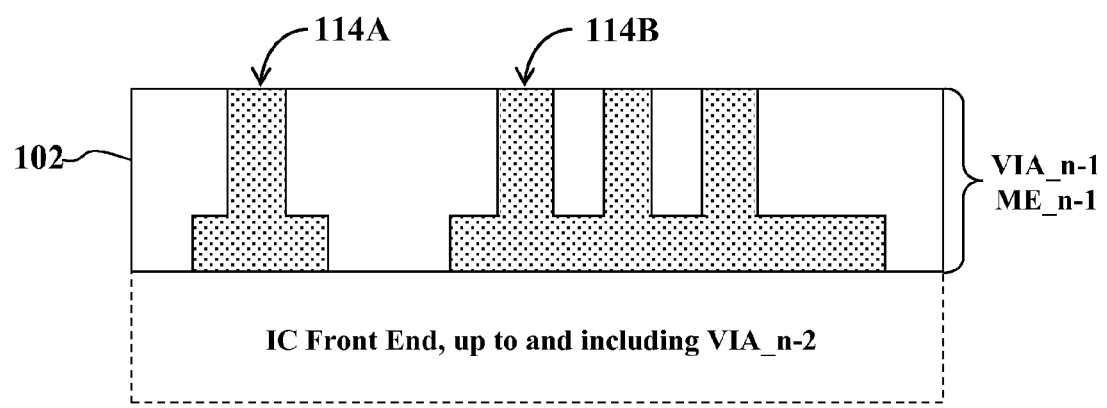

(51) Int. Cl.
  *H01L 27/06* (2006.01)
  *H01L 23/532* (2006.01)

(56) References Cited

U.S. PATENT DOCUMENTS

| | | | |
|---|---|---|---|
| 2007/0042542 A1 | 2/2007 | Barth et al. | |
| 2007/0184626 A1 | 8/2007 | Kamatani | |
| 2008/0081380 A1 | 4/2008 | Celii et al. | |
| 2008/0121953 A1 | 5/2008 | Summerfelt | |
| 2008/0157155 A1 | 7/2008 | Wang | |
| 2008/0157276 A1 | 7/2008 | Park | |
| 2009/0189249 A1* | 7/2009 | Woo | H01L 23/5223 257/532 |
| 2009/0272961 A1 | 11/2009 | Miller et al. | |
| 2010/0072474 A1* | 3/2010 | Abe | H01L 23/49855 257/57 |
| 2010/0237465 A1 | 9/2010 | Stribley et al. | |
| 2010/0279484 A1 | 11/2010 | Wang et al. | |
| 2011/0032660 A1* | 2/2011 | Dunn | H01G 4/1209 361/313 |
| 2011/0115005 A1* | 5/2011 | Coolbaugh | H01L 27/0629 257/296 |
| 2011/0163413 A1 | 7/2011 | Kim et al. | |
| 2011/0210422 A1 | 9/2011 | Imamura et al. | |
| 2011/0227194 A1 | 9/2011 | Jeannot et al. | |
| 2012/0171840 A1 | 7/2012 | Cho et al. | |
| 2012/0241908 A1* | 9/2012 | Tsao | H01L 27/0805 257/532 |
| 2013/0062733 A1 | 3/2013 | Summerfelt et al. | |
| 2013/0285200 A1* | 10/2013 | Chang | H01L 23/642 257/532 |
| 2014/0080282 A1 | 3/2014 | Chiang et al. | |
| 2014/0225222 A1* | 8/2014 | Yu | H01L 28/60 257/532 |
| 2014/0264732 A1* | 9/2014 | Elsherbini | H01L 27/06 257/531 |

OTHER PUBLICATIONS

Extended European Search Report, 121855183, Feb. 26, 2013.

* cited by examiner

METAL-INSULATOR-METAL (MIM) CAPACITOR

This invention relates to semiconductor structures and manufacturing. More particularly, the invention relates to the formation of metal-insulator-metal (MIM) capacitors.

MIM capacitors are widely available and are known for state-of-the art BiCMOS processes.

Currently, a MIM capacitor in a BiCMOS Integrated Circuit (IC) is made using the interconnect metal layer (otherwise referred to as the nth metal layer, MetalN or ME_n (i.e. the uppermost metal layer of n metal layers)) as the bottom plate of the MIM capacitor. The MIM dielectric and the MIM top plate are deposited on top of ME_n layer and patterned using an additional masking step to form the Capacitor Top Metal (CTM) layer. The MIM capacitor is connected with a via which is formed to make contact with both the top plate (i.e. the CTM layer) and the bottom plate (i.e. the ME_n layer).

A number of problems exist with this MIM capacitor manufacturing method. Firstly, the via etching process reaches the CTM layer much faster than the ME_n layer, thus resulting in over-etching which penetrates the CTM layer. Any roughness of the metal layer underlying the CTM layer can result in etching through the MIM stack, thereby creating a short when the via is formed. Secondly, etching of the CTM may leave residues in grooves (also due to metal roughness), which can result in a short between the CTM layer and the vias connecting the bottom plate.

According to an aspect of the invention there is provided a MIM capacitor according to independent claim 1.

Proposed is method of manufacturing a MIM capacitor for a BiCMOS IC by depositing the MIM stack within the interconnect metal layer. In other words, the sandwich arrangement of metal-insulator-metal layers (i.e. the MIM stack) forming the MIM capacitor is formed below at least part of a top layer/portion of an nth metal layer (ME_n). The interconnect metal layer may thus be adapted to provide an electrical connection to a metal layer of the MIM stack, such as the top metal layer of the MIM for example.

By avoiding formation of the MIM stack on top of the nth Metal layer (ME_n), the roughness of the nth metal layer (ME_n) is avoided and the maximum roughness experienced when forming the MIM stack is determined by inter-metal dielectric (IMD) layer (which is much smoother that the MetalN layer).

Connection to both terminals of the MIM capacitor may be made using vias formed below the nth Metal layer, which may be formed prior to depositing the MIM stack, and using vias formed on the (thicker) top interconnect metallization layer. Thus, the risk of the via etching process penetrating through the MIM capacitor is eliminated.

The MIM stack may be patterned in a single masking step, thereby avoiding the formation of residues (which can create shorts circuits).

Examples of the invention will now be described in detail with reference to the accompanying drawings, in which:

FIGS. 1-9 illustrate a process for manufacturing a MIM capacitor according to an embodiment of the invention.

The terms, chip, integrated circuit, monolithic device, semiconductor device, and microelectronic device, are often used interchangeably in this field. The present invention is applicable to all the above as they are generally understood in the field.

The terms metal line, interconnect line, trace, wire, conductor, signal path and signalling medium are all related. The related terms listed above, are generally interchangeable, and appear in order from specific to general. In this field, metal lines are sometimes referred to as traces, wires, lines, interconnect or simply metal. Metal lines, generally aluminum (Al), copper (Cu) or an alloy of Al and Cu, are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metals are examples of other conductors.

The terms contact and via, both refer to structures for electrical connection of conductors at different interconnect levels. These terms are sometimes used in the art to describe both an opening in an insulator in which the structure will be completed, and the completed structure itself. For purposes of this disclosure contact and via refer to the completed structure.

The term vertical, as used herein, means substantially orthogonal to the surface of a substrate. Also, terms describing positioning or location (such as above, below, top, bottom, etc) are to be construed in conjunction with the orientation of the structures illustrated in the diagrams.

FIG. 1 illustrates a device 100, having a substrate 102, typically comprised of silicon. Substrate 102 can have formed therein a plethora of microelectronic or micromechanical structures, as would be apparent to a person skilled in the semiconductor art. The substrate is provided with Tungsten (W) vias 114 using known IC processing techniques. Any excess Tungsten on the upper or lower surface of the substrate 102 may be removed by Chemical Metal Polishing (CMP), or other known techniques. Thus, FIG. 1 shows first 114A and second 114B vias formed in the substrate, and this is the n−1th metal layer (ME_n−1) and n−1th via layer (VIA_n−1). An IC front end can be provided below the substrate 102 layers up to and including the n−2th metal layer (ME_n−2) and the n−2th via layer (VIA_n−2).

Figure 2:
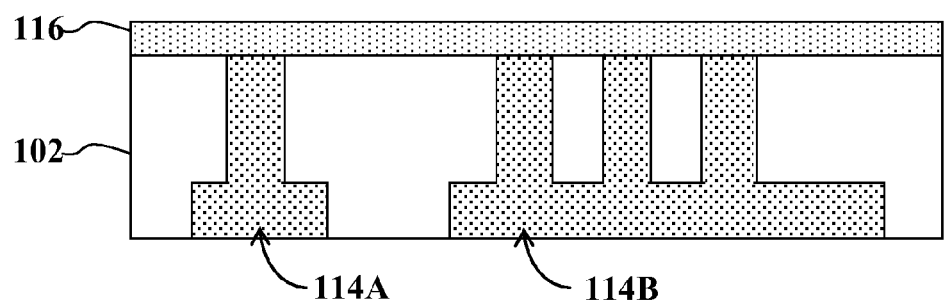

Subsequent formation of a first (lower) metal interconnect layer 116 covering the upper surface of the substrate 102 is illustrated in FIG. 2. The first metal interconnect layer 116 is a standard (i.e. conventional) Ti/TiN/AlCu interconnect layer forming part of the nth metal layer (ME_n). Here, the thickness of the first metal interconnect layer 116 is in the range of 50-150 nm, and so therefore thinner than the total ME_n layer thickness. Other suitable materials and/or thicknesses may be used, as would be apparent to a person skilled in the art.

Figure 3:
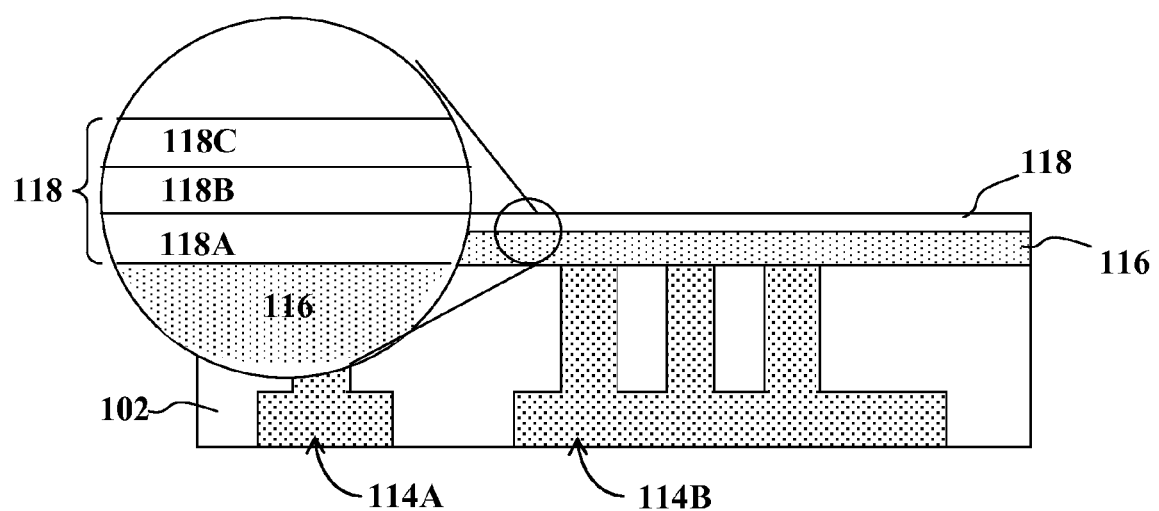

A MIM stack 118 is then formed on the first metal interconnect layer 116 as shown in FIG. 3. Here, the MIM stack 118 is formed from depositing a first 20 nm layer of TiN 118A on the first metal interconnect layer 116, then depositing a 40 nm layer of $Ta_2O_5$ 118B on the TiN layer 118A, and finally depositing a second 20 nm layer of TiN 118C on the $Ta_2O_5$ layer 118B. Thus, the first 20 nm layer of TiN 118A forms the bottom metal layer of the MIM stack 118, the $Ta_2O_5$ layer 118B forms the dielectric layer of the MIM stack 118, and the second 20 nm layer of TiN 118C forms the top metal layer of the MIM stack 118. Other suitable materials and/or thicknesses may be used for the MIM stack 118, as would be apparent to a person skilled in the art. For example, the thickness of the TiN layers may be in the range of 5-150 nm, preferably in the range of 5-100 nm, and even more preferably in the range of 10-40 nm. Also, the thickness of the $Ta_2O_5$ layer may be in the range of 5-150 nm, preferably in the range of 10-100 nm, and even more preferably in the range of 30-50 nm.

Figure 4:
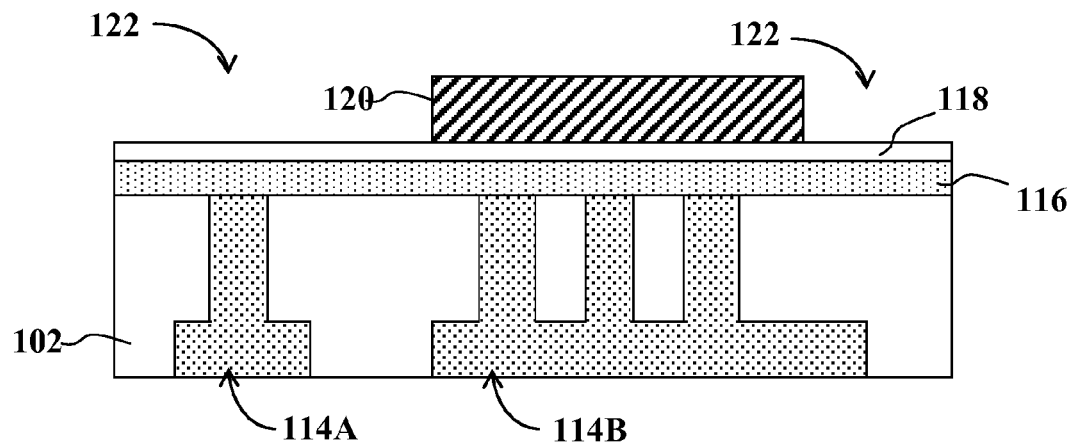

As shown in FIG. 4, a further mask layer 120 (e.g., photoresist or simply "resist") is formed on the top surface of the MIM stack 118 and is patterned according to known photolithographic techniques to form exposed areas 122 (and leave a region of the further mask layer 120 above the second via 114B). Here, it is preferred that the horizontal dimensions of the further mask layer 120 after being patterned (i.e. the region of the further mask layer 120 above the second via 114B) are larger than a later-used mask which defines the dimensions of the MIM capacitor (as will be described below in conjunction with FIG. 8). The further mask layer 120 is also referred to as a patterned masking layer or a second patterned masking layer.

Figure 5:
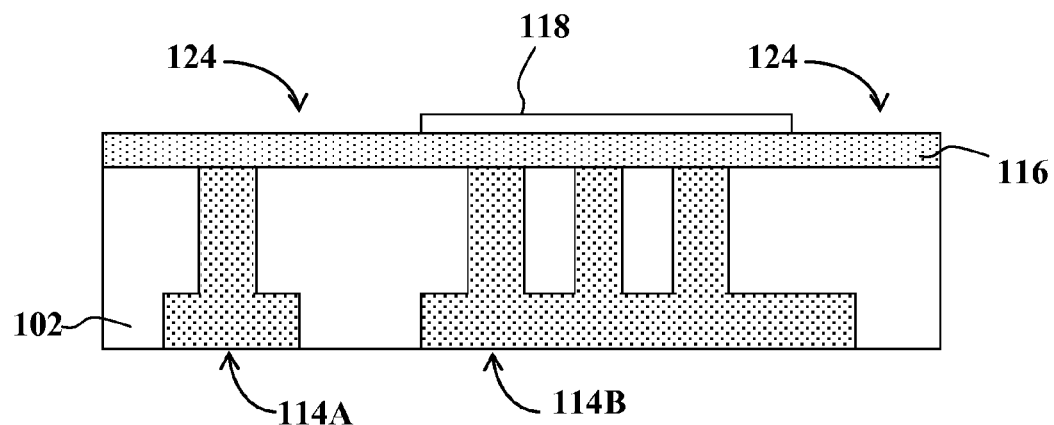

Spaces 124 in the MIM stack 118 are then chemically etched at the exposed areas 122, and the further mask layer 120 is then removed, resulting is the structure illustrated in FIG. 5.

Figure 6:
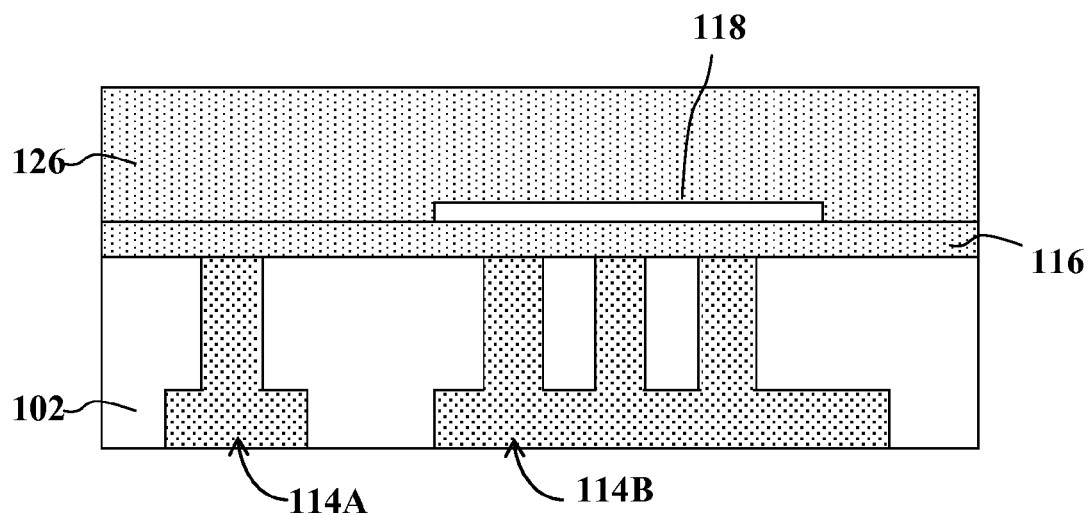

A second (upper) metal interconnect layer 126 is deposited to cover the upper surface of the first (lower) metal interconnect layer 116 and the MIM stack 118 as illustrated in FIG. 6. The top metal interconnect layer 126 is formed from ALCu and forms the remaining part of the nth metal layer (ME_n). Here, the thickness of the top metal interconnect layer 126 is in the range of 1-2 μm, but other suitable materials and/or thicknesses may be used, as would be apparent to a person skilled in the art. It will therefore be understood the first (lower) metal interconnect layer 116, the MIM stack 118, and the second (upper) metal interconnect layer 126 form the nth metal layer (ME_n), wherein the MIM stack 118 is formed below at least a portion of the second (upper) metal interconnect layer 126 and above the first (lower) metal interconnect layer 116. In other words, the MIM stack is formed within the nth metal layer (ME_n)

Figure 7:
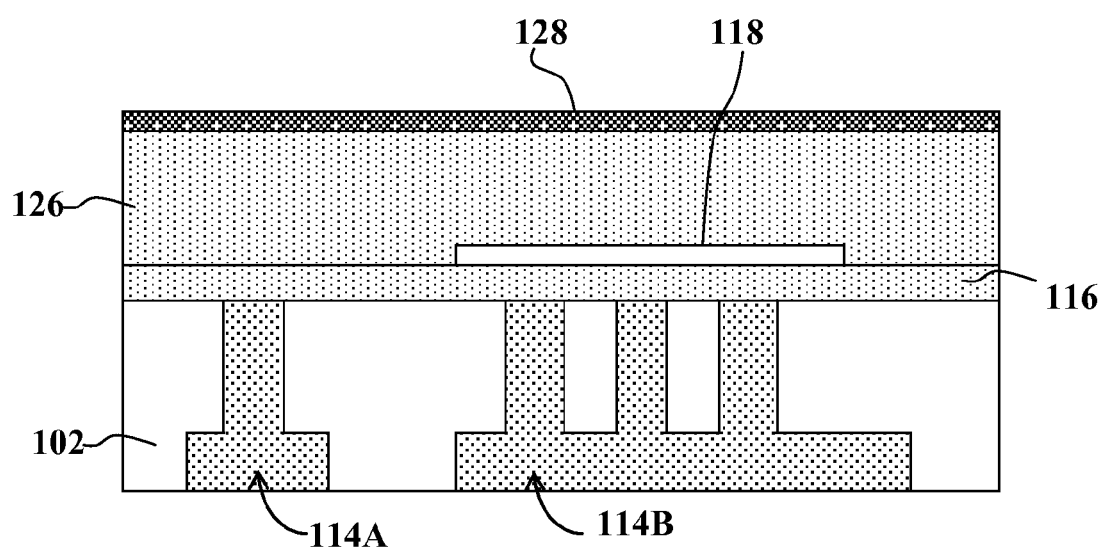

A TiN Anti-Reflective Coating (ARC) layer 128 is deposited on the top surface of the top metal interconnect layer 126 above the MIM stack as shown in FIG. 7. The ARC layer 128 is part of the nth metal layer (MEn).

Figure 8:
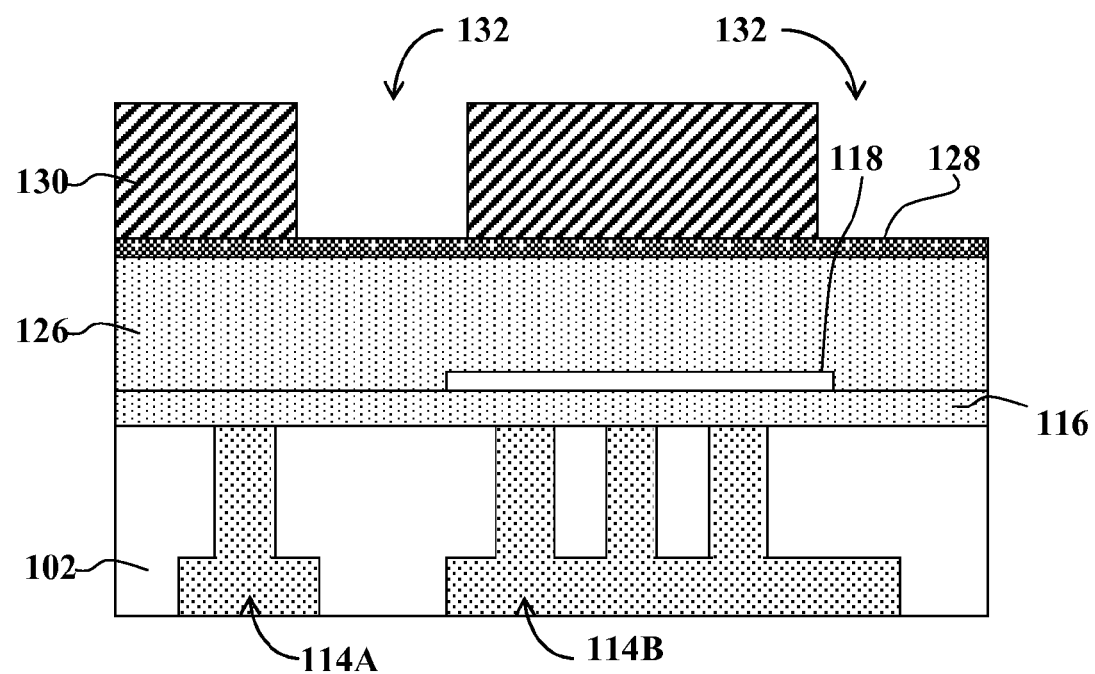

A final mask layer 130 (e.g., photoresist or simply "resist") is formed on the upper surface of the top metal interconnect layer 126 substrate 102 and the ARC layer 128 to form exposed areas 132 as shown in FIG. 8. As mentioned above, the horizontal dimensions of the final mask layer 130 above the MIM stack 118 are smaller than the MIM stack 118 and the ARC layer 128. Thus, when the exposed areas are etched 132, the final mask layer 130 does not cover (i.e. is not vertically above) portions of the ARC layer 128 and portions of the MIM stack 118. In this way, the horizontal dimensions of the final masking layer 130 above the MIM stack 118 will define the horizontal dimension of the MIM capacitor after etching.

Figure 9:
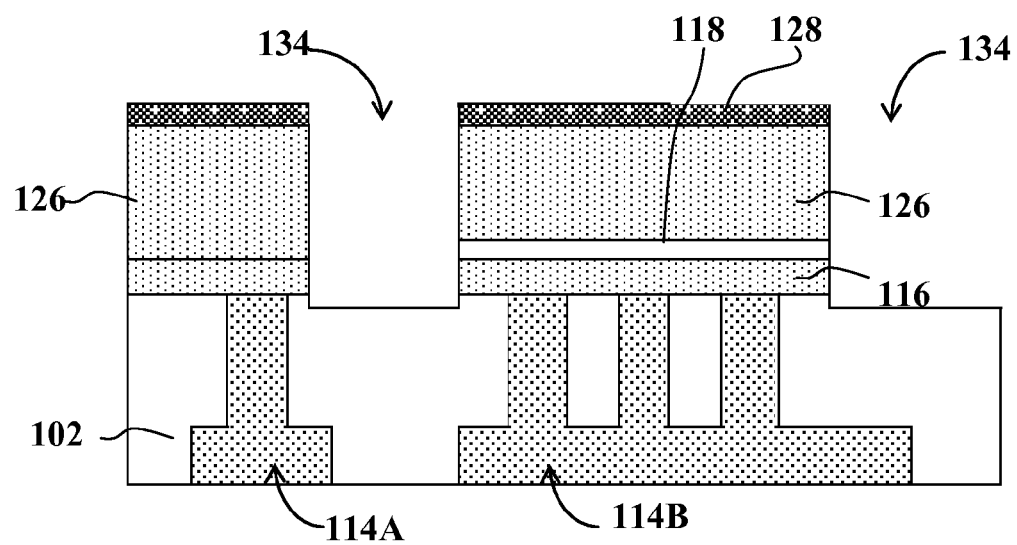

Trenches 134 in the substrate 102 are chemically etched (through the ARC layer 128 and the nth metal layer (ME_n)) at the exposed areas 132, and the final mask layer 130 is then removed using known techniques, resulting is the structure illustrated in FIG. 9.

From FIG. 9 it will be seen that a MIM capacitor is formed with an electrical connection to the bottom plate of the MIM capacitor being made with the vias 114B in the n−1th layer. Thus, unlike a conventional MIM capacitor, a MIM capacitor according to an embodiment of the invention does not require connections in the n+1th metal layer (ME_n+1) and can therefore be significantly smaller and exhibit smaller parasitic capacitances.

Also, since the bottom plate of the MIM capacitor includes a (low resistive) AlCu layer, a plurality or grid of vias may not be needed which helps to reduce the parasitic capacitance to the substrate 102.

Further, the roughness of the thick AlCu top metal interconnect layer 126 is not an issue in embodiments of the invention because the MIM stack 118 forming the MIM capacitor is situated under (i.e. below) the AlCu top metal interconnect layer 126.

To improve electro-migration properties, conventional AlCu interconnect metal layers are typically deposited at a higher temperature, in the range of 400-500° C. In this regime, large grains are formed, which helps to reduce electro migration. However, since this also results in increased roughness, when a conventional MIM capacitor is formed on top of a particular interconnect metal layer, this interconnect metal layer needs to be deposited at a lower temperature (typically in the range of 200-300° C.) to reduce the surface roughness. This comes at the cost of worse electro-migration properties.

Since, in proposed embodiments, the MIM stack is not formed on top, but is instead formed within the interconnect metal layer, the surface roughness on top of the interconnect metal layer is of no concern, and the layer can be deposited at the desired temperature to reach the required electro-migration properties. This means that, unlike a conventional MIM capacitor, cold deposition processes are not needed to ensure MIM integrity in embodiments, thus leading to improved electro-migration properties.

Embodiments also provide improved MIM reliability through avoidance of early breakdown or leakage that would otherwise be caused by spikes in the bottom plate or residue on the top plate resultant from roughness of the top metal interconnect layer.

The MIM capacitor is formed from dielectric sandwiched between two metal layers. To have good electrical performance, and especially to be symmetric with respect to positive or negative voltage bias, it is preferable that both interfaces (bottom metal to dielectric, and dielectric to top-metal) are identical. Conventional use of a TiN ARC layer thus results in the bottom interface being TiN to dielectric. Hence, in conventional arrangements, the top interface is also arranged to be dielectric to TiN. However, in proposed embodiments the ARC layer is no longer used as a bottom plate, therefore providing i) more freedom, and ii) the ARC is of no particular interest for the MIM (although it has been described in the embodiment of FIGS. 1-9 simply for regular interconnect processing).

Unlike conventional manufacturing processes which require two patterned masking layers to define the horizontal dimensions of the MIM capacitor, embodiments of the invention may only needs a single patterned masking layer (e.g. the final masking layer 130 shown in FIG. 8) to define the horizontal dimension of the MIM capacitor.

Various modifications will be apparent to those skilled in the art.

The invention claimed is:

1. A method manufacturing a metal-insulator-metal, MIM, capacitor, comprising:
    forming a MIM stack within an interconnect metal layer, the interconnect metal layer comprising a first interconnect metal layer part and a second interconnect metal layer part, wherein the interconnect metal layer forms an electrical connection to a metal layer of the MIM stack, the method further comprising,
    forming an opening in a substrate;
    forming a via metal layer in the opening of the substrate so as to form a via in the substrate;
    forming the first interconnect metal layer part on the substrate;

forming the MIM stack on the first interconnect metal layer part;

forming the second interconnect metal layer part on the MIM stack;

forming a mask layer on the second interconnect metal layer part:

patterning the mask layer to expose at least one region of the interconnect layer and to retain at least one portion of the mask layer above the MIM stack; and etching the exposed at least one region through the second interconnect metal layer part and through the first interconnect metal layer part to form at least one trench in the substrate;

wherein a horizontal dimension of the at least a portion of the mask layer above the MIM stack is less than the corresponding horizontal dimension of the MIM stack, such that the step of etching comprises etching through a portion of the MIM stack.

2. The method of claim 1, wherein the interconnect metal layer is an Nth metal layer for a BiCMOS process having an N+1th interconnect metal layer.

3. The method of claim 1, further comprising forming an anti-reflective coating layer on the interconnect metal layer, wherein the anti-reflective coating layer comprises titanium or titanium alloy.

4. The method of claim 1, wherein the interconnect metal layer comprises aluminum, aluminum alloy, copper, or copper alloy.

5. The method of claim 1, wherein at least one of the metal layers of the MIM stack comprises titanium or titanium alloy, and wherein the insulator layer of the MIM stack comprises a metal oxide or silicon nitride.

6. A method manufacturing a metal-insulator-metal (MIM) capacitor, comprising:

forming a first interconnect metal layer part on a substrate that includes at least one metal via:

forming a MIM stack on the first interconnect metal layer part and directly above the metal via;

forming the second interconnect metal layer part on the MIM stack and on exposed portions of the first interconnect metal layer;

forming a mask layer on the second interconnect metal layer part:

patterning the mask layer to expose at least one region of the second interconnect metal layer part and to retain at least one portion of the mask layer above the MIM stack;

etching through the second interconnect metal layer part and through the first interconnect metal layer part at the exposed at least one region to form at least one trench in the substrate;

wherein a horizontal dimension of the at least one portion of the mask layer above the MIM stack is less than the corresponding horizontal dimension of the MIM stack, such that the etching comprises etching through a portion of the MIM stack; and removing the patterned mask layer.

7. The method of claim 6, wherein the first and second interconnect metal layer parts form an interconnect metal layer that is an Nth metal layer for a BiCMOS process having an N+1th interconnect metal layer.

8. The method of claim 6, further comprising forming an anti-reflective coating layer on the second interconnect metal layer part, wherein the anti-reflective coating layer comprises titanium or titanium alloy.

9. The method of claim 6, wherein the first and second interconnect metal layer parts comprise aluminum, aluminum alloy, copper, or copper alloy.

10. The method of claim 9, wherein at least one of the metal layers of the MIM stack comprises titanium or titanium alloy, and wherein the insulator layer of the MIM stack comprises a metal oxide or silicon nitride.

11. The method of claim 6, wherein the first and second interconnect metal layer parts form an interconnect metal layer that is an Nth metal layer for a BiCMOS process having an N+1th interconnect metal layer;

further comprising forming an anti-reflective coating layer on the second interconnect metal layer part, wherein the anti-reflective coating layer comprises titanium or titanium alloy;

wherein the first and second interconnect metal layer parts comprise aluminum, aluminum alloy, copper, or copper alloy;

wherein at least one of the metal layers of the MIM stack comprises titanium or titanium alloy, and wherein the insulator layer of the MIM stack comprises a metal oxide or silicon nitride.

* * * * *